United States Patent
Blumrich et al.

(10) Patent No.: US 8,122,197 B2
(45) Date of Patent: Feb. 21, 2012

(54) MANAGING COHERENCE VIA PUT/GET WINDOWS

(75) Inventors: Matthias A. Blumrich, Ridgefield, CT (US); Dong Chen, Croton on Hudson, NY (US); Paul W. Coteus, Yorktown Heights, NY (US); Alan G. Gara, Mount Kisco, NY (US); Mark E. Giampapa, Irvington, NY (US); Philip Heidelberger, Cortlandt Manor, NY (US); Dirk Hoenicke, Ossining, NY (US); Martin Ohmacht, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 12/543,890

(22) Filed: Aug. 19, 2009

(65) Prior Publication Data

US 2009/0313439 A1 Dec. 17, 2009

Related U.S. Application Data

(62) Division of application No. 10/468,995, filed as application No. PCT/US02/05587 on Feb. 25, 2002.

(60) Provisional application No. 60/271,124, filed on Feb. 24, 2001.

(51) Int. Cl.
*G06F 12/00* (2006.01)
*G06F 13/00* (2006.01)
*G06F 13/28* (2006.01)

(52) U.S. Cl. ........ 711/141; 711/133; 711/134; 711/135; 711/136; 711/142; 711/143; 711/144; 711/145; 711/146

(58) Field of Classification Search .......... 711/133–136, 711/141–146
See application file for complete search history.

(56) References Cited

U.S. PATENT DOCUMENTS

| | | | | |
|---|---|---|---|---|
| 5,379,391 | A | * | 1/1995 | Belsan et al. ............... 711/114 |
| 5,537,588 | A | * | 7/1996 | Engelmann et al. ......... 711/144 |
| 5,841,973 | A | | 11/1998 | Kessler et al. |
| 5,864,738 | A | | 1/1999 | Kessler et al. |
| 5,958,019 | A | | 9/1999 | Hagersten et al. |
| 6,032,228 | A | | 2/2000 | Islam et al. |
| 6,085,295 | A | | 7/2000 | Ekanadham et al. |
| 6,119,205 | A | | 9/2000 | Wicki et al. |
| 6,148,416 | A | | 11/2000 | Masubuchi |
| 6,223,269 | B1 | | 4/2001 | Blumenau |
| 6,408,163 | B1 | * | 6/2002 | Fik ............................ 455/3.01 |
| 6,490,625 | B1 | | 12/2002 | Islam et al. |

(Continued)

OTHER PUBLICATIONS

MPI Documents, http://www.mpi-forum.org/docs/docs.html.

(Continued)

*Primary Examiner* — Yaima Campos
(74) *Attorney, Agent, or Firm* — Scully, Scott, Murphy & Presser, P.C.; Daniel P. Morris, Esq.

(57) ABSTRACT

A method and apparatus for managing coherence between two processors of a two processor node of a multi-processor computer system. Generally the present invention relates to a software algorithm that simplifies and significantly speeds the management of cache coherence in a message passing parallel computer, and to hardware apparatus that assists this cache coherence algorithm. The software algorithm uses the opening and closing of put/get windows to coordinate the activated required to achieve cache coherence. The hardware apparatus may be an extension to the hardware address decode, that creates, in the physical memory address space of the node, an area of virtual memory that (a) does not actually exist, and (b) is therefore able to respond instantly to read and write requests from the processing elements.

10 Claims, 1 Drawing Sheet

U.S. PATENT DOCUMENTS

2002/0078305 A1* 6/2002 Khare et al. .................. 711/144
2004/0006677 A1 1/2004 Kobayashi et al.

OTHER PUBLICATIONS

Snir, Re: non-blocking ops vs. threads, http://www.mpi-forum.org/archives/mail/mpi-core/0063.html, Jul. 12, 1995.

Salo, Re: non-blocking ops vs. threads, http://www.mpi-forum.org/archives/mail/mpi-core/0057.html, Jul. 11, 1995.

George, http://www.mpi-forum.org/archives/mail/mpi-core/0056.html, Jul. 11, 1995.

Office Action dated Apr. 6, 2011, received in a related application, namely U.S. Appl. No. 12/953,770.

* cited by examiner

MANAGING COHERENCE VIA PUT/GET WINDOWS

CROSS-REFERENCE TO RELATED APPLICATIONS

This application is a divisional of application Ser. No. 10/468,995, filed Nov. 20, 2004, now U.S. Pat. No. 7,870, 343, the disclosure of which is hereby incorporated herein by reference in its entirety.

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. U.S. patent application Ser. No. 10/468,999, for "Class Networking Routing"; U.S. patent application Ser. No. 10/469,000, for "A Global Tree Network for Computing Structures"; U.S. Pat. No. 7,444,385, for 'Global Interrupt and Barrier Networks"; U.S. Pat. No. 7,305,487, for 'Optimized Scalable Network Switch"; U.S. Pat. No. 7,313,582, for "Arithmetic Functions in Torus and Tree Networks'; U.S. Pat. No. 7,418,068, for 'Data Capture Technique for High Speed Signaling"; U.S. patent application Ser. No. 10/468, 995, for 'Managing Coherence Via Put/Get Windows'; U.S. Pat. No. 7,174,434, for "Low Latency Memory Access And Synchronization"; U.S. Pat. No. 7,330,996, for 'Twin-Tailed Fail-Over for Fileservers Maintaining Full Performance in the Presence of Failure"; U.S. Pat. No. 7,210,088, for "Fault Isolation Through No-Overhead Link Level Checksums'; U.S. patent application Ser. No. 10/469,003, for "Ethernet Addressing Via Physical Location for Massively Parallel Systems"; U.S. Pat. No. 7,185,226, for "Fault Tolerance in a Supercomputer Through Dynamic Repartitioning"; U.S. Pat. No. 6,895,416, for "Checkpointing Filesystem"; U.S. Pat. No. 7,315,877, for "Efficient Implementation of Multidimensional Fast Fourier Transform on a Distributed-Memory Parallel Multi-Node Computer"; U.S. Pat. No. 7,555,566, for "A Novel Massively Parallel Supercomputer"; and U.S. Pat. No. 6,592,449, for "Smart Fan Modules and System".

This invention was made with Government support under subcontract number B517552 under prime contract number W-7405-ENG-48 awarded by the Department of Energy. The Government has certain rights in this invention.

BACKGROUND

This invention relates to the field of distributed-memory message-passing parallel computer design and system software, as applied for example to computation in the field of life sciences.

In provisional patent application No. 60/271,124 titled "A Novel Massively Parallel Supercomputer," therein is described a massively parallel supercomputer architecture in the form of a three-dimensional torus designed to deliver processing power on the order of teraOPS (trillion operations per second) for a wide range of applications. The architecture comprises 65,536 processing nodes organized as a 64×32×32 three-dimensional torus, with each processing node connected to six (6) neighboring nodes.

Each processing node of the supercomputer architecture is a semiconductor device that includes two electronic processors (among other components). One of these processors is designated the "Compute Processor" and, in the common made operation, is dedicated to application computation. The other processor is the "I/O Processor," which, in the common mode of operation, is a service processor dedicated to performing activities in support of message-passing communication. Each of these processors contains a separate first-level cache (L1) which may contain a copy of data stored in a common memory accessed by both processors. If one processor changes its L1 copy of a memory location, and the other processor has a copy of the same location, the two copies become "coherent" if they are made to be the same.

Message passing is a commonly-known form of computer communication wherein processors explicitly copy data from their own memory to that of another node. In the dual-processor node disclosed in the above-identified provisional patent application No. 60/271,124, the I/O Processor is principally used to facilitate message passing between the common memory of a node and the common memory of other nodes. Therefore, it both produces data (when a message is received) that is consumed by the Compute Processor, and consumes data (in order to send a message) that is produced by the Compute Processor. As a result, it is very common for both processors to have a copy of the same memory location in their L1s. If the messages passed are small and many, then the problem is exacerbated. Thus, there is a clear need to find a way to make the L1s of each processor coherent, without extensive circuitry, and with minimal impact on performance.

As massively parallel computers are scaled to thousands of processing nodes, typical application messaging traffic involves an increasing number of messages, where each such message contains information communicated by other nodes in the computer. Generally, one node scatters locally-produced messages to some number of other nodes, while receiving some number of remotely produced messages into its local memory. Overall performance for these large-scale computers is often limited by the message-passing performance of the system.

For such data transfers, a common message-passing interface, described in the literature (see for example http://www.mpi-forum.org/docs/docs.html under MPI-2), is known as "one-sided communication." One-sided communication uses a "put/get" message-passing paradigm, where messages carry the source (for get) or the destination (for put) memory address. In parallel supercomputers operating on a common problem, puts and gets are typically assembled in batches and issued together. This keeps the independently operating processors in rough synchronization, maximizing performance. The time during which puts and gets occur is termed the put/get window. This window extends both in time (when it occurs) and in memory (over the range of memory addresses carried by the put or get messages). FIG. 2 shows a put/get window 30 having a number of distinct messages.

Put/get windows extend the concept of coherence to processors on different processing nodes of the massively parallel supercomputer. Implementations of put/get windows must insure that all messages put to a window during the time it is open are received into the memory of the window before the window is closed. Similarly, a get on the memory of the window is only allowed during the time the window is open. Therefore, put/get windows are simply a mechanism for a node to synchronize with remote processors operating on its memory.

The management of a put/get window is currently accomplished by either buffering the put/get messages or by using explicit synchronization messages. Buffering the messages consumes memory, which is always in limited supply.

Explicit synchronization for each window suffers from the long latency of round-trip messages between all the nodes accessing the window. Therefore, on large-scale machines such as the one described in copending U.S. Pat. No. 7,555,566, these approaches do not scale well because of limited memory for buffering, and because the number of nodes accessing any particular window often scales along with the number of processing nodes in the computer.

A long-standing problem in the field of computer design, is how to keep these L1 caches coherent. Typical solutions employ techniques known as "snooping" the memory bus of the other processor, which can be slow and reduce the performance of each processor. Alternatively, the processor that contains an old copy in L1 of the data in the common memory, can request a new copy, or mark the old copy obsolete, but this requires knowledge of when the copy became invalid. Sometime this knowledge is incomplete, forcing unnecessary memory operations, further reducing performance. Other computers make use of "interlocks," whereby one processor is granted permission to use certain data while the other processor cannot, but this permission involves interactions between the two processors, which usually requires additional complex circuitry in the semiconductor device, reducing the performance of the two processors.

Still other solutions in common practice disable all caching for areas of memory intended to be shared. This practice penalizes all memory accesses to these areas, not just those to the shared data.

BRIEF SUMMARY

An object of this invention is to provide an improved procedure for managing coherence in a parallel processing computer system.

Another object of the present invention is to achieve coherency between the first-level caches of the processors of a multi-processor node without extensive circuitry and with minimal impact on the performance of each processor.

A further object of the invention is to provide a method and apparatus, working in conjunction with software algorithms, to accomplish efficient high speed message-passing communications between processors or a direct memory access (DMA) device, which maintains coherence without significantly reducing performance.

These and other objectives are attained with the method and apparatus of the present invention. In accordance with a first aspect, the invention provides a software algorithm that simplifies and significantly speeds the management of cache coherence in a message passing massively parallel supercomputer (such as the one described in copending U.S. Pat. No. 7,555,566 containing two or more non-coherent processing elements (or even a DMA controller) where one processing element is primarily performing calculations, while the other element is performing message passing activities. In such a massively parallel supercomputer, algorithms often proceed as a series of steps, where each step consists of a computation phase followed by a communication phase. In the communication phase, the nodes exchange data produced by the computation phase and required for the next step of the algorithm. Because of the nature of the algorithms, the phases are usually tightly synchronized, so that the communication happens all at once over the entire machine. Therefore, the cost of managing the synchronization of put/get windows can be amortized over a large number of nodes at the start and end of each communication phase. Briefly, a global operation can be used to open many put/get windows at the start of a communication phase, and a second global operation can be used to close the windows at the end of the communication phase.

Because the I/O Processor cannot actually send or receive the messages until after cache coherence has been guaranteed, the invention provides a mechanism to ensure that the data being "put" (sent) is not in the cache of either processor, and that the data being "gotten" (received) is also not in the cache of either processor. By coordinating these activities upon opening and closing the "Put/Get Window", the invention reduces the total amount of work required to achieve coherence and allow that work to be amortized over a large number of individual messages. Also, since both processing elements within a node must perform this work, the invention enables this to happen concurrently. Further, when required, these activities can be coordinated over a large number of independent nodes in the massively parallel machine by employing the Global Barrier Network described in copending U.S. Pat. No. 7,555,566.

In accordance with a second aspect, the invention provides a hardware apparatus that assists the above-described cache coherence software algorithm, and limits the total time (or latency) required to achieve cache coherence over the Put/Get Window. This apparatus is a simple extension to the hardware address decoder that creates, in the physical memory address space of the node, an area of memory that (a) does not actually exist, and (b) is therefore able to respond instantly to read and write requests from the processing elements. This further speeds the coherence activities because it allows garbage data (which the processor will never use) to be pulled into the processor's cache, thereby evicting just the modified data and displacing unmodified data with optimal performance. The performance is faster because this garbage data does not actually need to be fetched from memory, rather, the memory controller need only instantly reply.

The performance is also faster because only modified data is written to memory from cache, while clean data is simply instantly discarded. Further, for the case where the total size of the "Put/Get Window" exceeds, perhaps greatly, the size of the processor's cache, cleaning the cache in this manner provides an upper bound on the total amount of work that is required to ensure that no data from the communication area remains in the cache. It may be noted that, independent of the above-described software algorithms, this hardware device is useful for computer systems in general which employ a Least Recently Used cache replacement policy.

Also, two specific software instructions may be used in the preferred implementation of the invention. One instruction, termed "data cache block flush and invalidate", may be used to write data from the memory area of the first processor into the shared memory area, while at the same time, preventing the first processor from using data the data written in its memory area. A second software instruction, termed "data cache block zero", may be used to write data from the memory area of the first processor into the shared memory. By using these, or similar software instructions, the method and apparatus of the invention, working in conjunction with software algorithms, achieve high speed message passing communications between nodes, while maintaining coherence without significantly reducing performance.

Further benefits and advantages of the invention will become apparent from a consideration of the following detailed description, given with reference to the accompanying drawings, which specify and show preferred embodiments of the invention.

DETAILED DESCRIPTION

Figure 1:
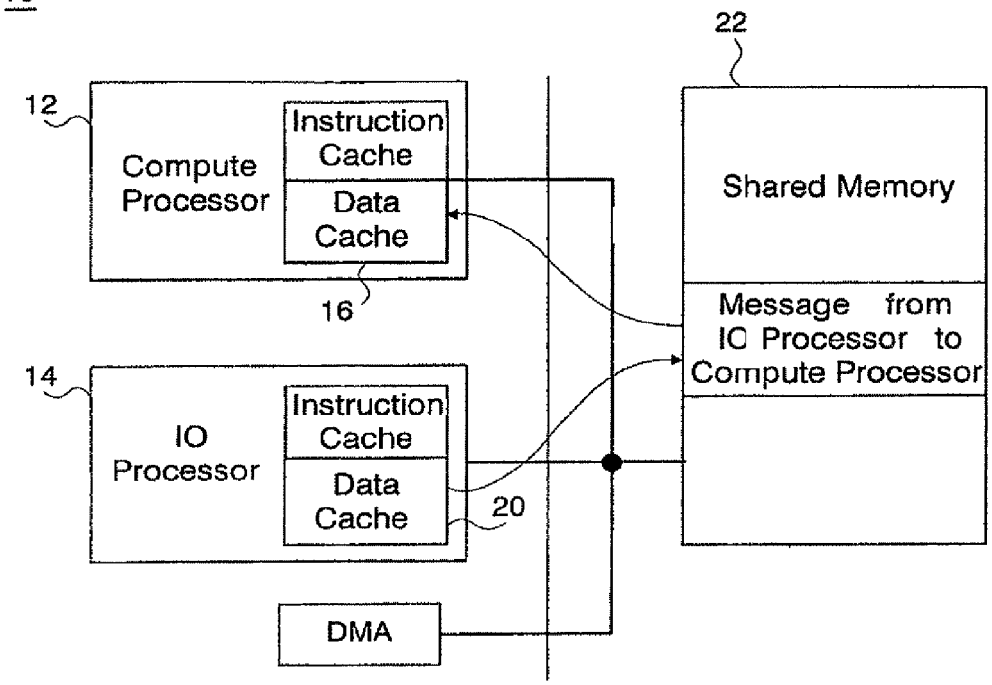
FIG. 1 shows a two processor node embodying this invention.

The present invention relates to a method and apparatus for managing coherence of a multi-processor computer system. FIG. 1 illustrates a node 10 that may embody this invention. Each of the processors 12, 14 of node 10 has a respective cache memory area 16, 20, and the two processors share a third memory area 22. Generally the present invention relates to a software algorithm that simplifies and significantly speeds the management of cache memory coherence in a message passing parallel computer, and to hardware apparatus that assists this cache coherence algorithm. The software algorithm uses the opening and closing of put/get windows to coordinate the activities required to achieve cache coherence. The hardware apparatus may be an extension to the hardware address decode, that creates, in the physical memory address space of the node, an area of physical memory that (a) does not actually exist, and (b) is therefore able to respond instantly to read and write requests from the processing elements.

As indicated above, this invention utilizes a principal referred to as "put/get" data transfer. As parallel multi-computers are scaled to increasing numbers of nodes, typical application messaging traffic involves an increasing number of messages, where each such message contains a piece of work performed by other nodes in the multi-computer. Generally, one node scatters locally produced work items to numerous other nodes (a "put"), while assembling numerous remotely produced work items into its local memory (a "get"). Overall performance for these multi-computers is often gated by the message passing performance of the system.

Figure 2:
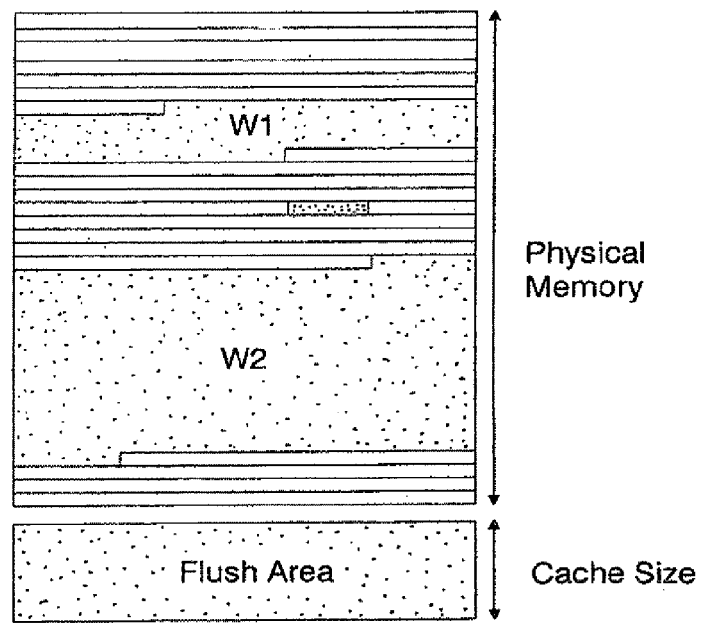
FIG. 2 illustrates a put/get window that may be used in the practice of this invention.

For such data transfers, a particularly efficient message-passing interface, described in the literature (see for example http://www.mpi-forum.org/docs/docs.html, under MPI-2), is known as One-Sided Communication. One-Sided Communication uses a "put/get" message-passing paradigm, where messages carry the source (for "get") or destination (for "put") memory address. In parallel supercomputers operating on a common problem, typically puts and gets are assembled in batches and issued simultaneously. This keeps independently operating processors in rough synchronization, allowing good performance on a common problem. This time during which puts and gets occur is termed the put/get window. This window extends both in time (when it occurs) and in memory (over which range of memory addresses does the data in the put or get reside). FIG. 2 shows a put/get window 30 having a number of distinct messages In such a massively parallel supercomputer, algorithms often proceed as a series of steps, where each step consists of a computation phase followed by a communication phase. In the communication phase, the nodes exchange data produced by the computation phase and required for the next step of the algorithm. Because of the nature of the algorithms, the phases are usually tightly synchronized, so that the communication happens all at once over the entire machine. Therefore, the cost of managing the synchronization of put/get windows can be amortized over a large number of nodes at the start and end of each communication phase. Briefly, a global operation can be used to open many put/get windows at the start of a communication.

The present invention utilizes this put/get window to provide a simple means to manage memory coherence. In accordance with a first aspect, a software algorithm is provided that simplifies and significantly speeds the management of cache coherence in a message passing massively parallel supercomputer (such as the one described in copending U.S. Pat. No. 7,555,566 containing two or more non-coherent processing elements (or even a DMA controller) where one processing element is primarily performing calculations, while the other element is performing message passing activities. Briefly, this algorithm uses the opening and closing of "Put/Get Windows" to coordinate the activities required to achieve cache coherence.

Because the messages cannot actually be sent or received until after cache coherence has been guaranteed, this invention provides a mechanism to ensure that the data being "put" (sent) is not in the cache of either processor, and that the data being "gotten" (received) is also not in the cache of either processor. By coordinating these activities upon opening and closing the "Put/Get Window", this invention reduces the total amount of work required to achieve coherence and allow that work to be amortized over a large number of individual messages. Also, since both processing elements within a node must perform this work, this invention enables this to happen concurrently. Further, when required, these activities can be coordinated over a large number of independent nodes in the massively parallel machine by employing the Global Barrier Network described in copending U.S. Pat. No. 7,555,566.

This algorithm is assisted by the hardware, described below, but even in the absence of the apparatus benefits message-passing computers in general. Without the apparatus, a special reserved area of physical memory, equal in size to the processor's cache may be utilized, albeit at reduced performance by loading from this physical area into cache by issuing a DCBT (Data Cache Block Touch) instruction for each cache line of the reserved physical area.

In accordance with a second aspect of the invention, a novel hardware apparatus is provided that assists the above-described cache coherence algorithm, and limits the total time (or latency) required to achieve cache coherence over the Put/Get Window. This apparatus is a simple extension to the hardware address decoder that creates, in the physical memory address space of the node, an area of virtual memory that (a) does not actually exist, and (b) is therefore able to respond instantly to read and write requests from the processing elements. This further speeds the coherence activities because it allows garbage data (which the processor will never use) to be pulled into the processor's cache, thereby evicting just the modified data and displacing unmodified data with optimal performance. The performance is faster because this garbage data does not actually need to be fetched from memory, rather, the memory controller need only instantly reply.

The performance is also faster because only actually modified data is written to memory from cache, while clean data is simply instantly discarded. Further, for the case where the total size of the "Put/Get Window" exceeds, perhaps greatly, the size of the processor's cache, cleaning the cache in this manner provides an upper bound on the total amount of work that is required to ensure that no data from the communication area remains in the cache. For example, assuming a fully associative cache, if the communication area is 16 Megabytes (common occurrence), traditional cache flush techniques would require (16 MB/32 B per cache line equals) 524,288

DCBF instructions, while the algorithm described here would require at most 1,000 DCBT instructions if the processor's cache was 32 Kilobytes in size with 32 byte cache lines. It may be noted that, independent of the above-described software algorithm, this hardware device is useful for computer systems in general which employ a Least Recently Used cache replacement policy.

Two specific software embodiments are described below. The first embodiment may be preferred if the size of the message being received is smaller than the size of L1, while the second embodiment may be preferred if the size of the message received is larger than L1.

First Embodiment

If the Size of the Message being Received is Smaller than the Size of L1

In this case, the invention makes use of a software instruction termed "data cache block flush and invalidate" (DCBF), whereby a contiguous range of memory is written from L1 back to the common memory. DCBF is a PowerPC BookE instruction; similar instructions exist for other processors. At the same time, the data in the cache is marked as invalid, and cannot be used without reloading contents of the common memory. A DCBF is issued for every line in the address window.

More specifically, when the window is opened for puts or gets, software, (in the communication library) instructs the receiving processor (the compute Processor in our dual processor node) to flush the contents of L1 in the address window, as described above. This simple operation insures that the data in common memory are the same as the data in the compute processor's cache, and further, because of the invalidate, allows an opportunity for the I/O processor to change the contents of the common memory. The software then instructs the I/O processor to proceed until all expected messages arrive. The software then allows the computer processor to continue to process instructions, and closes the put/get window using a global synchronization operation such as the global barrier described in copending U.S. Pat. No. 7,444,385 Global Interrupt and Barrier Networks.

Second Embodiment

If the Size of the Message Received is Larger than the Size of L1

In this case, the invention makes use of an instruction termed "data cache block zero" (DCBZ), to reserve a continuous physical address range equal in size to L1. DCBZ creates a new cache line with contents of zero. If a new cache line is not available, then another cache line in L1 (for example, the least recently used line), has its data written back to the common memory, and is then zero'ed with the address given by the DCBZ instruction. DCBZ is a PowerPC BookE instruction; similar instructions exist for other processors. The software executes DCBZ to each line of the reserved area consecutively, where a line of the reserved area is equal in size to a cache line and like-aligned. This causes all lines in the L1 to be flushed, i.e., all modified lines are written back to common memory, because the entire contents of L1 is replaced quickly from the reserved area. The software then allows the compute processor to continue to process instructions, and closes the put/get window using a global synchronization operation such as the global barrier described in copending application U.S. Pat. No. 7,444,385 Global Interrupt and Barrier Networks.

It may be notes that the reserved physical space need not exist in physical memory, only that accesses to the space must not cause access violations. All writes to this reserved memory space must be acknowledged by the memory controller. All reads to this reserved space must immediately return an arbitrary (i.e. "garbage") value to the requesting processor's L1. Note further that such an apparatus also provides the most efficient means for an un-privileged (a.k.a. user-space) program to flush and invalidate the entire contents of the L1 cache.

It may also be noted that if DCBF instructions are slower than DCBZ, then the operating system may use the DCBZ instruction for messages smaller then L1 and vice-versa.

Using this invention, the I/O Processor need not flush its cache at all if the communication memory space is marked write-through to its L1 cache.

The making of the above-mentioned global "and" in a short interval of time, which allows the put/get window to be made temporarily narrow, is discussed in detail in related U.S. Pat. No. 7,313,582.

While it is apparent that the invention herein disclosed is well calculated to fulfill the objects previously stated, it will be appreciated that numerous modifications and embodiments may be devised by those skilled in the art, and it is intended that the appended claims cover all such modifications and embodiments as fall within the true spirit and scope of the present invention.

What is claimed is:

1. Hardware apparatus configured to clean data from a cache and configured to assist achieving cache coherence in a message passing parallel computer including a multitude of processing nodes, each of the processing nodes including first and second non-coherent processing elements, where the first processing element is principally performing calculations, while the second processing element is performing message passing activities, and each of said first and second processing elements having a respective cache memory area, the hardware apparatus comprising:

a memory controller configured to create, in a physical memory address space of one of the processing nodes, an area of virtual memory that (a) does not actually exist, and (b) is therefore configured to respond instantly to read and write requests from the processing elements; and said memory controller displacing modified data in the cache memory areas of the first and the second processing elements with garbage data that the first and the second processing elements will not use.

2. Hardware apparatus according to claim 1, wherein the memory controller allows garbage data, which the processor will never use, to be pulled into the processor's cache, thereby evicting just the modified data and displacing unmodified data with optimal performance.

3. Hardware apparatus according to claim 2, wherein the garbage data does not actually need to be fetched from memory, rather, the memory controller need only instantly reply.

4. Hardware apparatus according to claim 3, wherein only actually modified data is written to memory from cache, while clean data is simply instantly discarded.

5. Hardware apparatus according to claim 4, wherein cleaning the cache in this manner provides an upper bound on the total amount of work that is required to ensure that no data from the communication area remains in the cache.

6. A method of operating computer hardware apparatus to clean data from a cache and to assist achieving cache coherence in a message passing parallel computer including a multitude of processing nodes, each of the processing nodes including first and second non-coherent processing elements, where the firest processing element is principally performing calculations, while the second processing element is performing message passing activities, and each of said first and second processing elements having a respective cache memory area, the method comprising the steps:

using a memory controller to create, in a physical memory address space of one of the processing nodes, an area of virtual memory that (a) does not actually exist, and (b) is therefore configured to respond instantly to read and write requests from the processing elements of the node; and said memory controller displacing modified data in the cache memory areas of the first and the second processing elements with garbage data that the first and the second processing elements will not use.

7. A method according to claim 6, wherein the memory controller allows garbage data, which the processor will never use, to be pulled into the processor's cache, thereby evicting just the modified data and displacing unmodified data with optimal performance.

8. A method according to claim 7, wherein the garbage data does not actually need to be fetched from memory, rather, the memory controller need only instantly reply.

9. A method according to claim 8, wherein only actually modified data is written to memory from cache, while clean data is simply instantly discarded.

10. A method according to claim 9, wherein cleaning the cache in this manner provides an upper bound on the total amount of work that is required to ensure that no data from the communication area remains in the cache.

* * * * *